United States Patent
Boswell et al.

(10) Patent No.: US 7,298,624 B2
(45) Date of Patent: Nov. 20, 2007

(54) DATA STORAGE DEVICE CHASSIS, CASE AND CLAMP MECHANISM

(75) Inventors: Graham P Boswell, Southampton (GB); Mark Scicluna, Long Sutton (GB)

(73) Assignee: Xyratex Technology Limited, Hampshire (GB)

( * ) Notice: Subject to any disclaimer, the term of this patent is extended or adjusted under 35 U.S.C. 154(b) by 0 days.

(21) Appl. No.: 10/417,111

(22) Filed: Apr. 17, 2003

(65) Prior Publication Data

US 2003/0222550 A1    Dec. 4, 2003

Related U.S. Application Data

(60) Provisional application No. 60/383,126, filed on May 28, 2002.

(51) Int. Cl.
*H05K 5/02* (2006.01)
(52) U.S. Cl. .................. 361/727; 361/683; 361/724; 361/816; 361/818
(58) Field of Classification Search ............ 361/683, 361/685, 686, 816, 818, 724–727; 174/35 R, 174/35 G; 349/59; 312/223.1, 223.2, 332.1, 312/333; 248/633, 634, 636, 638, 618
See application file for complete search history.

(56) References Cited

U.S. PATENT DOCUMENTS

| | | | | |
|---|---|---|---|---|
| 4,813,194 A | * | 3/1989 | Dobyns et al. | .......... 52/309.13 |
| 5,142,447 A | * | 8/1992 | Cooke et al. | ............... 361/685 |
| 5,483,423 A | * | 1/1996 | Lewis et al. | ................ 361/816 |
| 6,466,449 B1 | * | 10/2002 | Sheen et al. | ................ 361/752 |

\* cited by examiner

*Primary Examiner*—Anatoly Vortman
*Assistant Examiner*—Anthony Q. Edwards
(74) *Attorney, Agent, or Firm*—Pillsbury Winthrop Shaw Pittman LLP (57) ABSTRACT

A data storage device chassis for housing a plurality of data storage devices has a plurality of walls at least some of which have at least one guide strip along at least part of the length of the wall to define a plurality of bays in which data storage devices (18) can be housed. The guide strips support respective data storage devices in the bays such that the data storage devices can be slid into and out of the bays by sliding along the guide strips. The at least some of the walls are composed of a non-metallic material such that the surface of said guide strips along which a data storage device slides is non-metallic. Each of said at least some of the walls have an electrically conductive portion passing through the wall to provide for electrical conduction between the bays thereby providing electrical shielding for data storage devices housed in the bays.

14 Claims, 8 Drawing Sheets

DATA STORAGE DEVICE CHASSIS, CASE AND CLAMP MECHANISM

This application claims priority to U.S. provisional application No. 60/383,126, filed May 28, 2002, the entire content of which is hereby incorporated by reference.

BACKGROUND

1. Field of Invention

The present invention relates generally to a data storage device chassis, a wall therefor, and a data storage device case and clamp mechanism.

2. Discussion of Related Art

As is well known, data storage devices, such as disk drive units, are used to store data. In many applications, plural data storage device are housed in a single chassis and are removable therefrom for maintenance or replacement as and when necessary. In practice, it is desirable to fit as many data storage devices in a single chassis as possible in order to save space. A typical known chassis of standard 19" rack width and height of 3U (5¼") may hold 12 or 15 data storage devices at most, the devices being arranged in a regular array.

A number of difficulties arise in the design of a chassis of this type, particularly when trying to accommodate a greater number of data storage devices in a standard volume as space is at a premium and thin chassis walls are therefore required.

First, it is important to ensure that the cases of the data storage devices are held securely in the chassis and particularly in a way that minimises vibration of the data storage device. In the case of disk drive units, it is important to minimise the rotary vibrations that can arise because of the spinning disk.

It is furthermore important to minimise any damage to the chassis or data storage device case that might arise on sliding the data storage device in and out of the chassis. Given that data storage devices are typically housed in metal cases, it is important to ensure that metal flakes or other particles do not scrape off the data storage device case or the chassis because such metallic particles can interfere with the proper operation of the data storage device in use. One known solution to this particular problem is to glue or rivet plastics strips along the metal runners of metal walls that define the bays for the data storage devices in the chassis. Practical problems with this approach include the fact that the plastics strips are often not glued or otherwise fixed in the correct place and that they may become loose and even detached after repeated sliding in and out of the data storage devices. The use of discrete plastics strips also increases the parts count and the gluing or other fixing of the plastics strips adds significantly to the labour costs.

In such a chassis, it is furthermore important to ensure that electromagnetic interference both out of and into the chassis is minimised, not only to meet legal requirements in regard to emissions but also to minimise the possibility of the operation of the data storage devices being affected by stray electromagnetic radiation entering the chassis.

BRIEF DESCRIPTION OF THE INVENTION

According to a first aspect of the present invention, there is provided a data storage device chassis for housing a plurality of data storage devices, the chassis having a plurality of walls, at least some of the walls having at least one guide strip along at least part of the length of the wall to define a plurality of bays in which data storage devices can be housed, said guide strips supporting respective data storage devices in the bays such that said data storage devices can be slid into and out of the bays by sliding along the guide strips, said at least some of the walls being composed of a non-metallic material such that the surface of said guide strips along which a data storage device slides is non-metallic, each of said at least some of the walls having an electrically conductive portion passing through the wall to provide for electrical conduction between the bays thereby providing electrical shielding for data storage devices housed in the bays.

The use of a non-metallic material for the wall and particularly for the guide strip or strips along which the data storage devices slide means that there is no metal-to-metal contact between the data storage device and the wall. This in turn avoids the scraping of metal, which can otherwise lead to formation of metallic particles that can affect performance of the data storage devices. This construction furthermore avoids having to glue or otherwise fix strips of plastics along the guide strips along which the data storage devices slide, thus reducing the parts count and labour costs and avoiding the problem of such plastics strips becoming detached in use. The non-metallic wall can be formed very cheaply and yet have the high stiffness required of such a wall in a data storage device chassis.

Said guide strips may project into respective bays for supporting respective data storage devices in the bays. As an alternative, the guide strips may be in the form of recesses in the respective walls.

In an embodiment, the non-metallic material of said at least some of the walls is plastics. Plastics is preferred because it can be manufactured simply at low cost and within a narrow range of dimensional tolerances. Also, through selection of the appropriate plastics material, the walls can have a very high stiffness, which is important in minimising vibration of data storage devices housed in the chassis. In a preferred embodiment, the non-metallic material of said at least some of the walls is polycarbonate.

In an embodiment, the electrically conductive portion of said at least some of the walls is metal.

In a preferred embodiment, the non-metallic material of said at least some of the walls is plastics and the electrically conductive portion of said at least some of the walls is metal, each of said walls being formed by over-moulding the metal electrically conductive portion with plastics such that the metal electrically conductive portion is held captive in the plastics part of the wall. The use of over-moulding, which will be discussed further below, allows for simple, low cost and accurate manufacture of the walls. The metal electrically conductive portion preferably has projecting ears that are engaged by the plastics part of the wall to hold the metal electrically conductive portion captive in the plastics part of the wall.

According to a second aspect of the present invention, there is provided a wall for a data storage device chassis that houses a plurality of data storage devices, the wall having at least one guide strip along at least part of the length of the wall, the guide strip being constructed and arranged to at least partially support a respective data storage device in the data storage device chassis such that said data storage device can be slid into and out of the chassis by sliding along the guide strip, the wall being composed of a non-metallic material such that the surface of said guide strip along which a data storage device slides is non-metallic, the wall having an electrically conductive portion passing through the wall to provide for electrical conduction across the wall to enable electrical shielding for data storage devices housed in the chassis.

In an embodiment, the non-metallic material of said wall is plastics.

In an embodiment, the non-metallic material of said wall is polycarbonate.

In an embodiment, the electrically conductive portion of said wall is metal.

In a preferred embodiment, the non-metallic material of said wall is plastics and the electrically conductive portion of said wall is metal, said wall being formed by over-moulding the metal electrically conductive portion with plastics such that the metal electrically conductive portion is held captive in the plastics part of the wall.

The metal electrically conductive portion preferably has projecting ears that are engaged by the plastics part of the wall to hold the metal electrically conductive portion captive in the plastics part of the wall.

According to a third aspect of the present invention, there is provided a method of manufacturing a wall for a data storage device chassis that houses a plurality of data storage devices, the method comprising: placing a conductive strip in a mould; introducing molten non-metallic material into the mould; and, allowing the molten non-metallic material to solidify; the conductive strip being supported in the mould such that the conductive strip is held captive by the solidified non-metallic material and passes through the non-metallic portion of the wall to provide for electrical conduction across the wall.

The conductive strip preferably has projecting ears that are engaged by the non-metallic portion of the wall to hold the conductive strip captive in the non-metallic portion of the wall.

In an embodiment, the non-metallic material of the wall is plastics.

In an embodiment, the non-metallic material of the wall is polycarbonate.

In an embodiment, the electrically conductive strip is metal.

According to another aspect of the present invention, there is provided a data storage device chassis and a data storage device case having a clamp mechanism for clamping the data storage device case in the data storage device chassis, the clamp mechanism comprising: a lever mounted for pivotable movement about a pivot axis between an open position in which the data storage device case is unclamped and a closed position in which the data storage device case is clamped; the lever having a cam surface constructed and arranged to engage a cam surface in the data storage device chassis in the closed position; the lever cam surface having a bevel substantially parallel to the pivot axis and the chassis cam surface having a complementary bevel such that, as the lever is pivoted about the pivot axis from the open position towards the closed position, the bevels on the lever cam surface and the chassis cam surface engage to clamp the data storage device case in the data storage device chassis.

The use of bevelled cam surfaces causes the data storage device case to be drawn closely into and clamped strongly against the adjacent wall of the data storage device chassis. This gives the effect of an interference fit in the clamped position, whereas sliding in and out of the data storage device can be an easy, almost loose fit. The strong clamp load that can be applied serves to minimise vibrations that may arise during operation of the data storage device.

In a preferred embodiment, the lever cam surface is positioned at one end of the lever and the opposite end of the lever has a projecting tab that engages in a slot in the data storage device case when the data storage device case is in the clamped position.

According to another aspect of the present invention, there is provided a data storage device case having a clamp mechanism for clamping the data storage device case in a data storage device chassis, the clamp mechanism comprising: a lever mounted for pivotable movement about a pivot axis between an open position in which the data storage device case is unclamped and a closed position in which the data storage device case is clamped; the lever having a cam surface constructed and arranged to engage a cam surface in a data storage device chassis in the closed position; the lever cam surface having a bevel substantially parallel to the pivot axis and for engagement with a complementary bevel on a said chassis cam surface such that, as the lever is pivoted about the pivot axis from the open position towards the closed position, the bevels on the lever cam surface and the chassis cam surface engage to clamp the data storage device case in the data storage device chassis.

In a preferred embodiment, the lever cam surface is positioned at one end of the lever and the opposite end of the lever has a projecting tab that engages in a slot in a said data storage device case when the data storage device case is in the clamped position.

According to yet another aspect of the present invention, there is provided a data storage device chassis for housing one or more data storage devices, the chassis having walls that define an aperture through which a module can be passed to be housed in the chassis, the periphery of the aperture being surrounded by an electromagnetic interference shielding gasket, the gasket having a base portion and an upstanding portion upstanding therefrom that engages a said module when a said module is housed in the chassis, the base portion of the gasket being received in a recess or recesses in the walls of the chassis to retain the gasket in position around the aperture, the recess or recesses having an opening through which the upstanding portion of the gasket projects into the periphery of the aperture.

This arrangement means that the gasket does not have to be fixed by gluing, rivetting or the like, which reduces labour costs and helps to ensure that the gasket is correctly positioned initially and that the gasket stays in the correct position in use. In practice, the base portion of the gasket will typically be slid into the recess from an end of the recess or recesses during assembly of the chassis.

The opening of the recess or recesses preferably has a width that is substantially the same as the cross-sectional width of the upstanding portion of the gasket. This arrangement assists in making a close sealing engagement between the gasket and the module as it provides some support for the upstanding portion of the gasket.

The gasket is preferably generally T-shape in cross-section such that the base portion of the gasket is generally rectangular in cross-section and the upstanding portion of the gasket is upstanding generally centrally therefrom.

BRIEF DESCRIPTION OF THE DRAWINGS

Embodiments of the present invention will now be described by way of example with reference to the accompanying drawings, in which.

DETAILED DESCRIPTION OF THE PREFERRED EMBODIMENT

Figure 1:
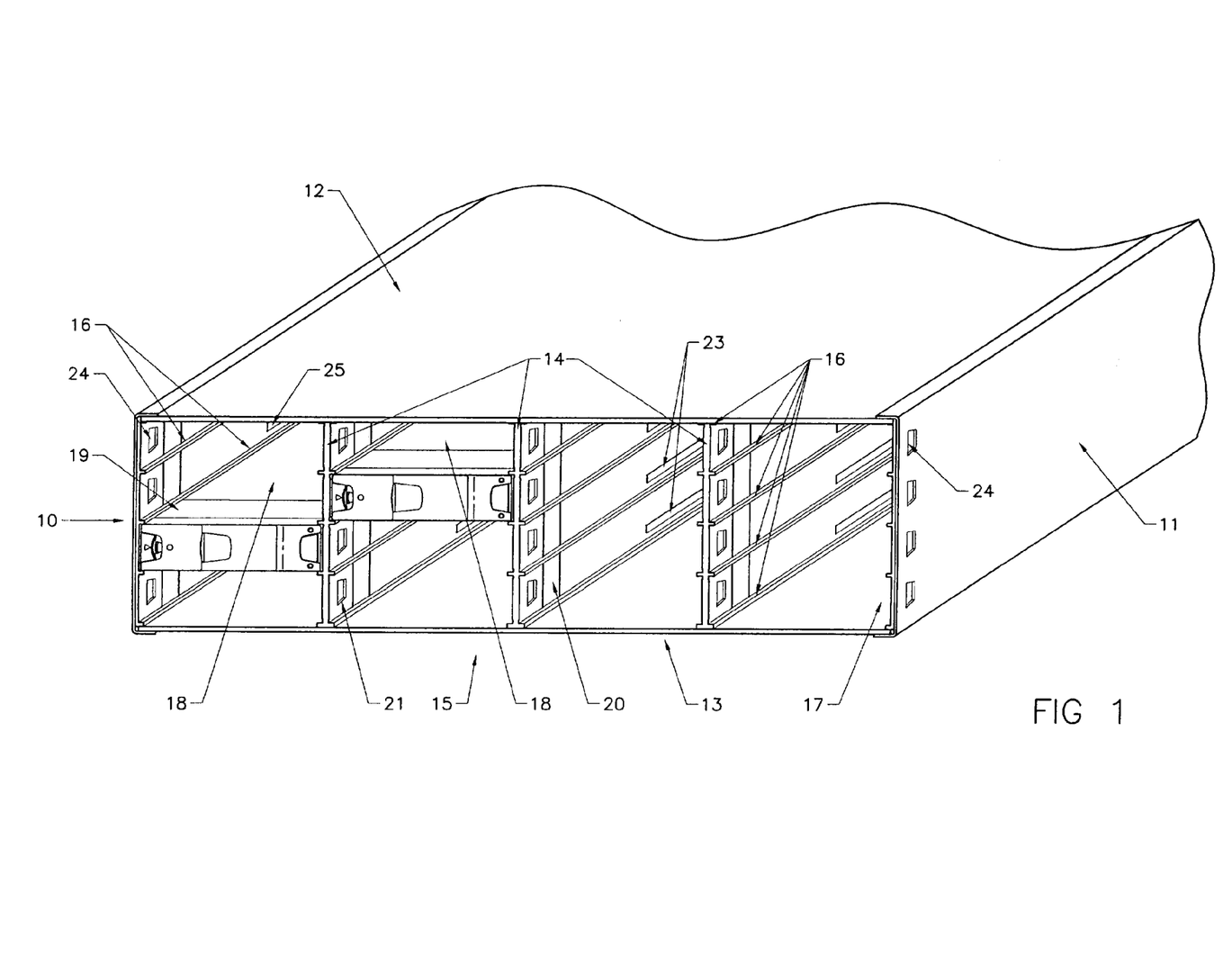
FIG. 1 is a perspective view from the front of an example of a data storage device chassis according to an embodiment of the present invention.
Figure 2:
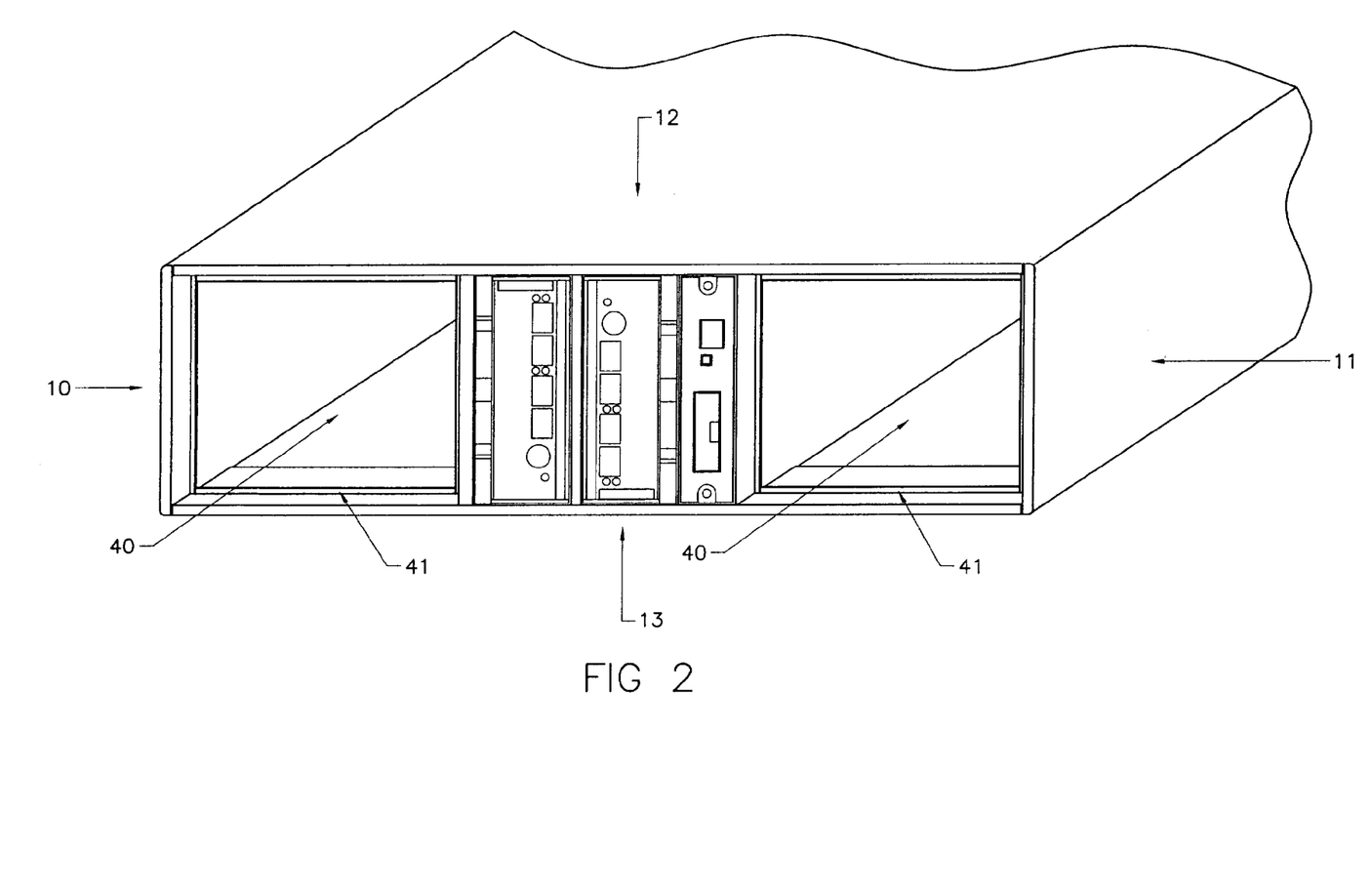
FIG. 2 is a perspective view from the rear of the chassis of FIG. 1.

Referring initially to FIGS. 1 and 2, a generally box-like data storage device chassis 10 has side walls 11, a top wall 12 and a bottom wall 13. Three vertical mid walls 14 pass from the front 15 to approximately the mid point of the chassis 10. Each mid-wall 14 has on each side five guide strips 16 and the inner most facing surfaces of the side walls 11 have similar guide strips 16 which together in this example define a regular array of 4×4 bays 17. Each bay 17 can receive a data storage device 18 which can be slid into and out of the base 17 through the open front 15 of the chassis 11, the guide strips 16 providing the surface along which the cases 19 of the data storage devices 18 slide.

A preferred arrangement for the walls 14 will now be described with particular reference to FIGS. 3 to 6. Each wall 14 is generally rectangular in shape. The main body of the wall 14 is made of a non-metallic material, preferably plastics and in one embodiment polycarbonate. The wall 14 contains a conductive strip 20, which may be an aluminium casting. In the most preferred embodiment, the wall 14 is formed by over-moulding the conductive strip 20 with the plastics material of the body of the wall 14. For this purpose, the conductive strip 20 has through holes 47 which can be used to mount the conductive strip 20 on pegs in a moulding tool whilst plastics material is introduced into the tool. The conductive strip 20 has plural projecting ears 48 on each side which are encapsulated by the moulded plastics material of the wall 14 in order to hold the conductive strip 20 securely in the formed wall 14. Moreover, as can be seen particularly clearly in FIG. 3, the guide strips 16 overlie the conductive strip 20, again serving to hold the conductive strip 20 securely in place.

This arrangement for forming the wall 14, including the selection of materials and the method of manufacture, has several distinct advantages in the context of a wall as used in a data storage device chassis 10. In particular, in a chassis 10 for a plurality of data storage devices 18, space is at a premium as it is always desirable to fit as many data storage devices as possible across the standard rack width of 19". The dividing walls must therefore be thin. On the other hand, it is also desirable to construct the chassis 10 so that the chassis 10 can itself act to minimise vibration passing into and out of the data storage devices 18. Where the data storage devices 18 are disk drives which have spinning disks, it is important to damp the rotary vibrations that can arise during operation of the disk drives. These vibration damping requirements imply that the walls 14 should have a high stiffness. Last, it is necessary that the walls 14 be formed within close tolerances given their function not only in supporting the data storage devices but also in minimising vibrations. All of these requirements are met in the preferred embodiment of the wall 14 and its method of manufacture as described above.

Figure 3:
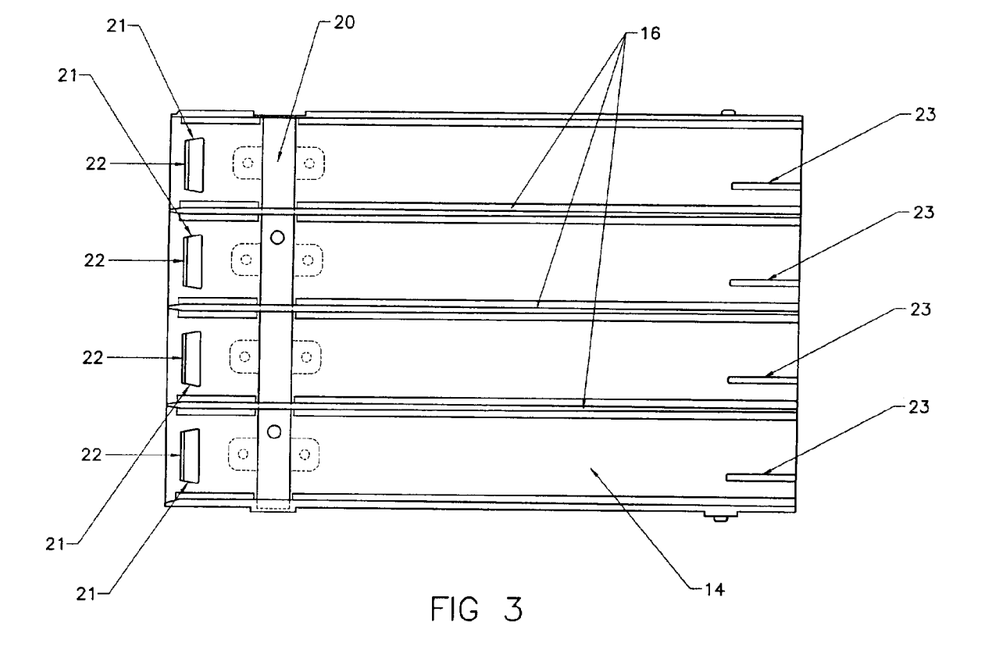
FIG. 3 is a side elevation of an example of a mid-wall of a data storage device chassis in accordance with an embodiment of the present invention.
Figure 4:
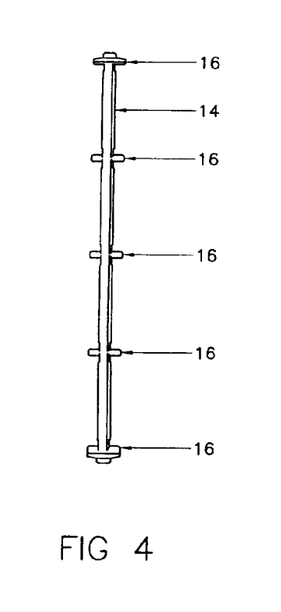
FIG. 4 is an end elevation of the wall of FIG. 3.
Figure 5:
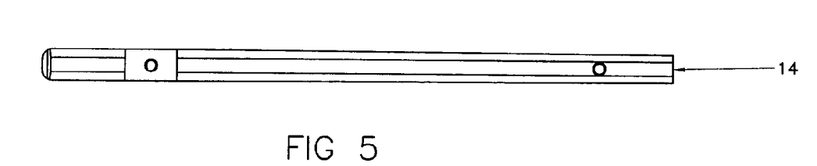
FIG. 5 is a plan view from above of the wall of FIG. 3.
Figure 6:
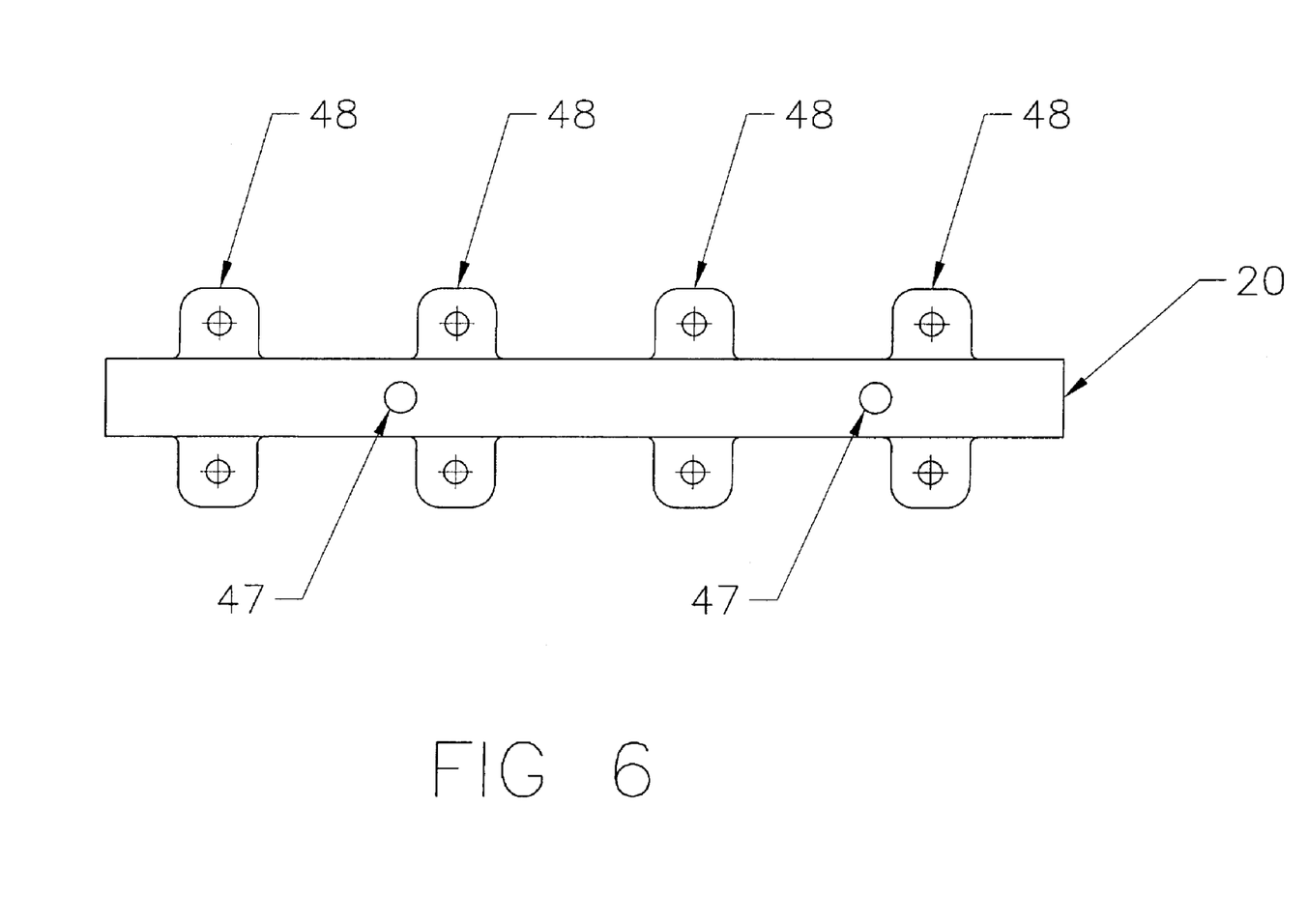
FIG. 6 is a side elevation of an electrically conductive strip of the wall of FIG. 3.

In the preferred embodiment, the walls 14 each have a generally trapezoidal slot 21 in the region of the wall 14 at the front of each bay 17. Each of these trapezoidal slots 21 has a bevelled leading edge 22. Moreover, a short keying rib 23 is provided on each side of the wall 14 at the portion at the rear of each bay 17. The chassis 10 has similar trapezoidal slots 24 and short keying ribs 25 for the left most and right most bays. The function of these features will be discussed further below.

Figure 7A:
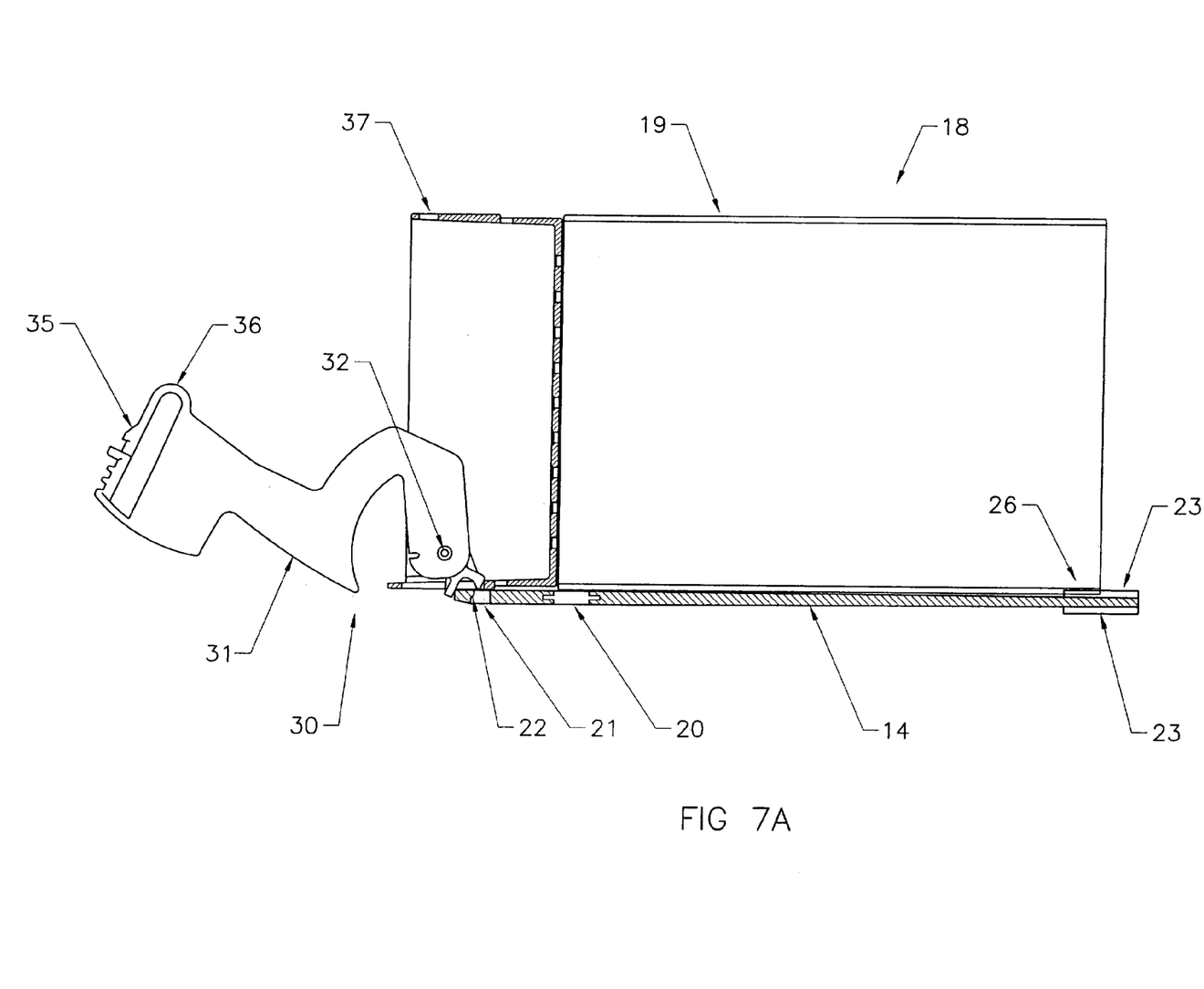
FIGS. 7A to 7C are partially sectioned views from above of an example of a data storage device having a clamp mechanism engaging a wall of a data storage device chassis in accordance with an embodiment of the present invention, the clamp mechanism being shown in a fully open, partially open and a clamped position respectively; and, FIG. 8 is a sectioned perspective view of the periphery of openings at the rear of a data storage device chassis in accordance with an embodiment of the present invention.
Figure 7B:
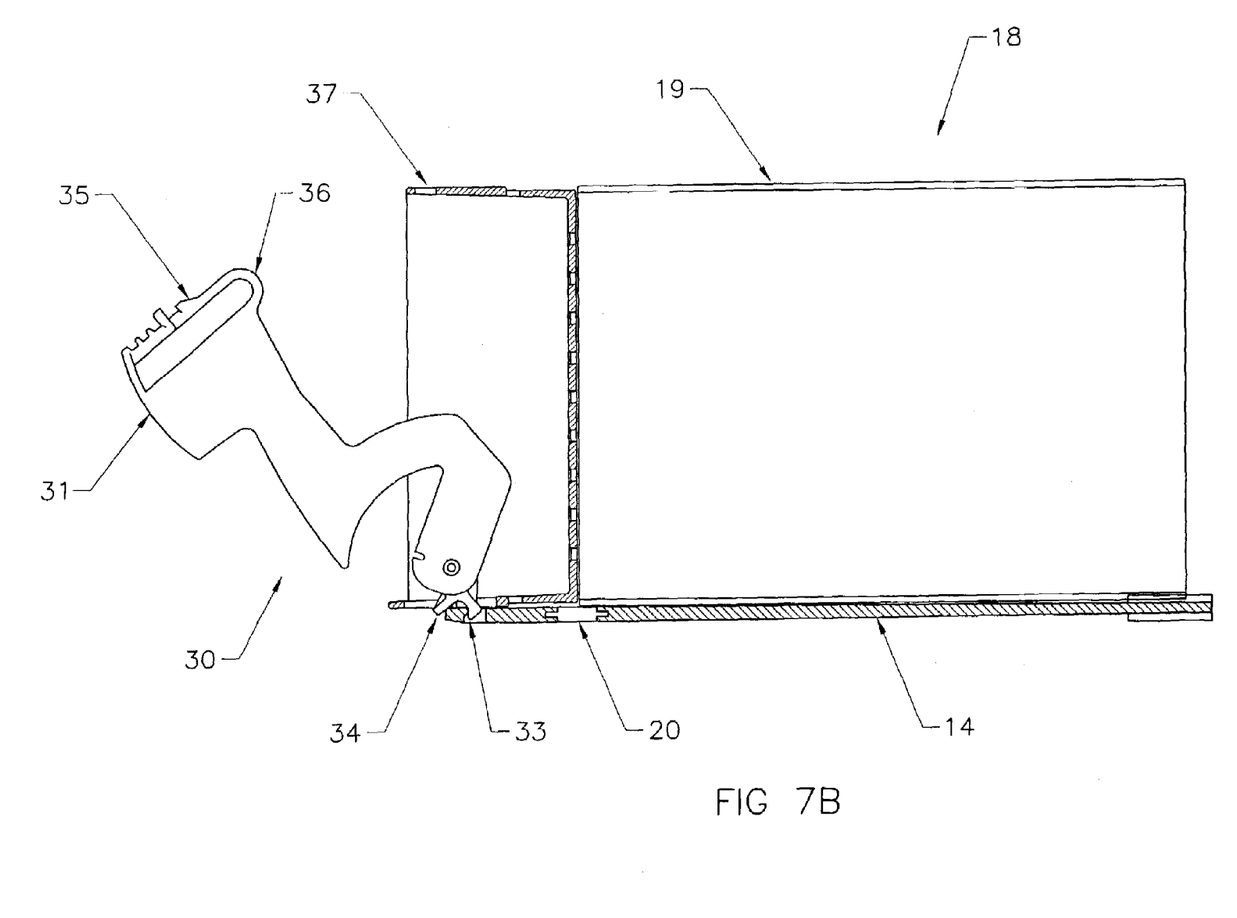
Figure 7C:
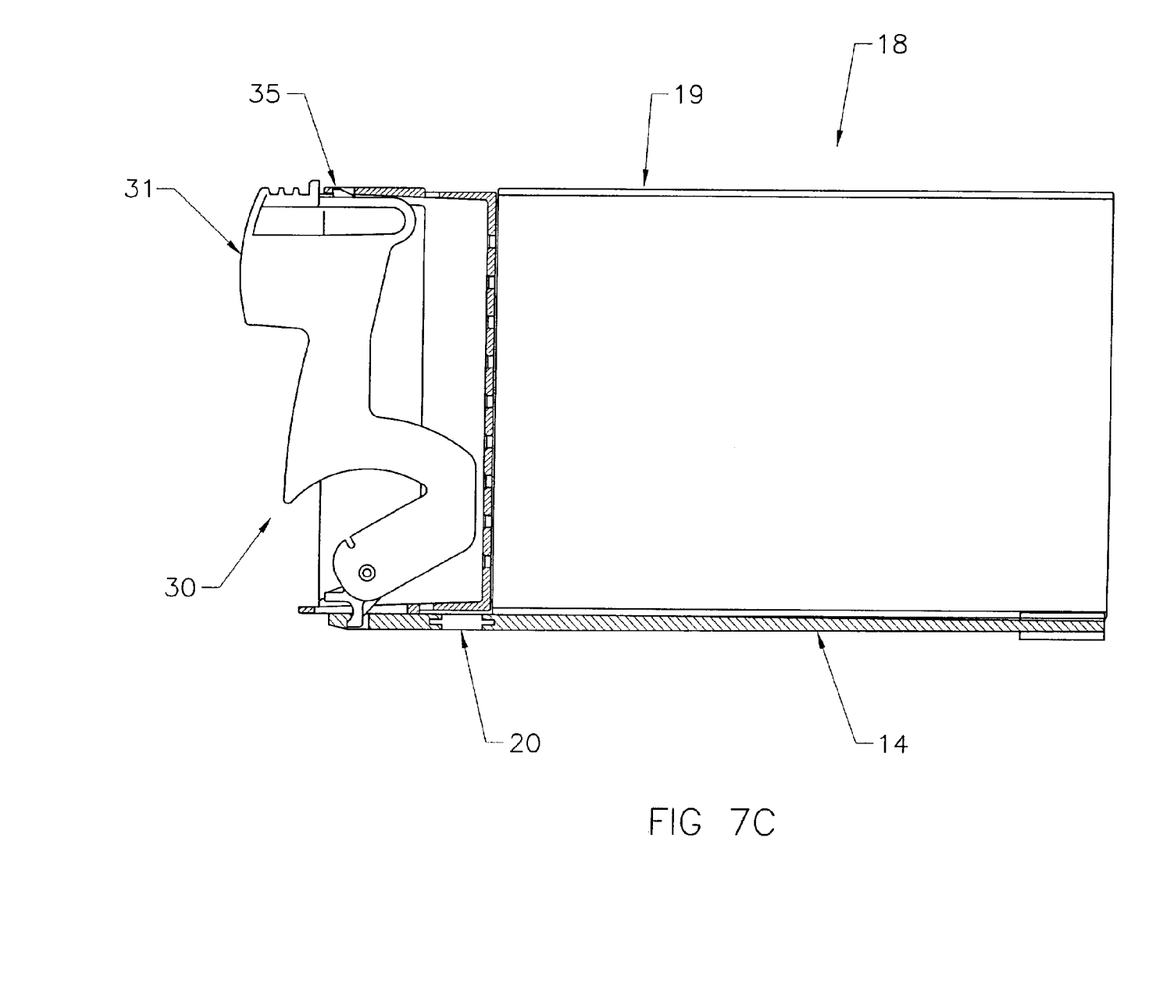

Referring now to FIGS. 7A to 7C, each data storage device 18 is generally rectangular in plan and fits snugly in a respective bay 17 in the chassis 10. The case 19 contains the actual storage device such as a hard disk, read/write heads, etc. (not shown). The data storage device 14 has a clamp mechanism 30 which includes an operating lever 31 which is pivotable about a pivot 32 which is perpendicular to the direction of insertion of the data storage device 18 and parallel to the bevelled edge 22 of the trapezoidal slots 21,24. The operating lever 31 has a cam surface having a corresponding bevel 33 on a leading edge. The lever 31 furthermore has a projecting stop 34 close to the bevel 33.

As a data storage device 18 is slid into a bay 17 of the chassis 10, the case 19, which is typically metal, slides along the guide strips 16 that define the bay 17. Because the guide strips 16 are provided by the non-metallic and preferably plastics wall 14, there is no sliding of metal on metal. This serves practically to reduce to zero the possibility of metal flakes or particles scraping off any of the components when the data storage device 18 is moved into and out of position in the chassis 10, thereby reducing the risk of damage or other interference to the electronic components of the chassis 10 and the data storage devices 18. Moreover, avoiding the metal-on-metal contact of typical known arrangements means that the action of sliding the data storage devices 18 in and out has a much better "feel" for the user or operator.

The case 19 of the data storage device has short elongate keying recesses 26 which correspond to and receive the respective keying ribs 23,25 of the walls 14 or chassis 10 as the data storage device 18 moves towards its fully home position in the bay 17. The ribs 23,25 are a loose fit in the recesses 26 so that they do not interfere with engagement of the data and power connector at the back of the data storage device 18 with the data and power connector provided in the chassis 10 at the rear of each bay 17. These keying ribs 23,25 and recesses 26 help to ensure that the data storage device 18 is inserted the right way up and, indeed, help to ensure that the correct module is being inserted into the chassis 10.

As can be seen in FIG. 7A, as the data storage device 18 moves towards its fully home position, the stop 34 of the lever 31 abuts the leading edge of the wall 14 (or chassis wall 11 as the case may be). At that point, the lever 31 is then pivoted, this action causing the bevel 33 of the lever cam surface to engage the bevel 22 in the trapezoidal slot 21,24 in the wall 14 or chassis 10 as the case may be. This can be seen most clearly in FIG. 7B. Further pivoting of the lever 31 and the resultant action of the bevelled surfaces 33,22 against each other clamps the case 19 of the data storage device 18 securely against the wall 14,11 on that side. The end of the lever 31 opposite the cam surface 33 has a projecting tab 35 on the end of a resilient U-shape formation 36 which engages in a slot 37 in the case 19 when the data storage device 18 is in the fully clamped position shown in FIG. 7C. This provides a lock against accidental opening of the clamp mechanism 30.

In the fully clamped position, the metal walls of the data storage device case 19 engage the conductive strips 20 of the mid walls 14 and also the metal side walls 11 of the chassis 11, optionally through metal leaf springs mounted on the case 19. This metal-to-metal contact provides an earth path between all of the data storage devices 18 in the bays 17 of the chassis 10. This serves to reduce electromagnetic interference either entering or leaving the chassis 10. Thus, despite the non-metallic material used for the walls 14, earthing conduct can be made through the walls 14 in a simple manner and is effected whenever the data storage device 18 is in its clamped position in a bay 17.

In a manner known per se, the pivot 32 may travel slightly in a direction along the length of the case 19 when the data storage device 18 is moved into its fully home position. Similarly, in a manner known per se, a torsion spring may be mounted around the pivot 32 which winds up to its full force as the lever 31 is moved to its home position. These effects act together to provide a load on the case 19 towards the rear of the chassis 10, which serves to ensure that the power and data connections between the data storage device 18 and the chassis components at the rear of the data storage device 18 are strongly made.

The combined action of the bevelled cam surface 33 of the lever 31 engaging the bevelled cam surfaces 22 of the trapezoidal slot 21,24, the engagement of the cam surface 33 in the trapezoidal slot 21,24 itself, and the engagement of the data and power connector on the data storage device 18 with the connector on the motherboard at the rear of the bay 17, provides for a secure 3-point mounting of the case 19 in the bay 17, with the case 19 being locked in three perpendicular axes. This results in extremely efficient damping of vibrations and provides strong resistance against shock.

Figure 8:
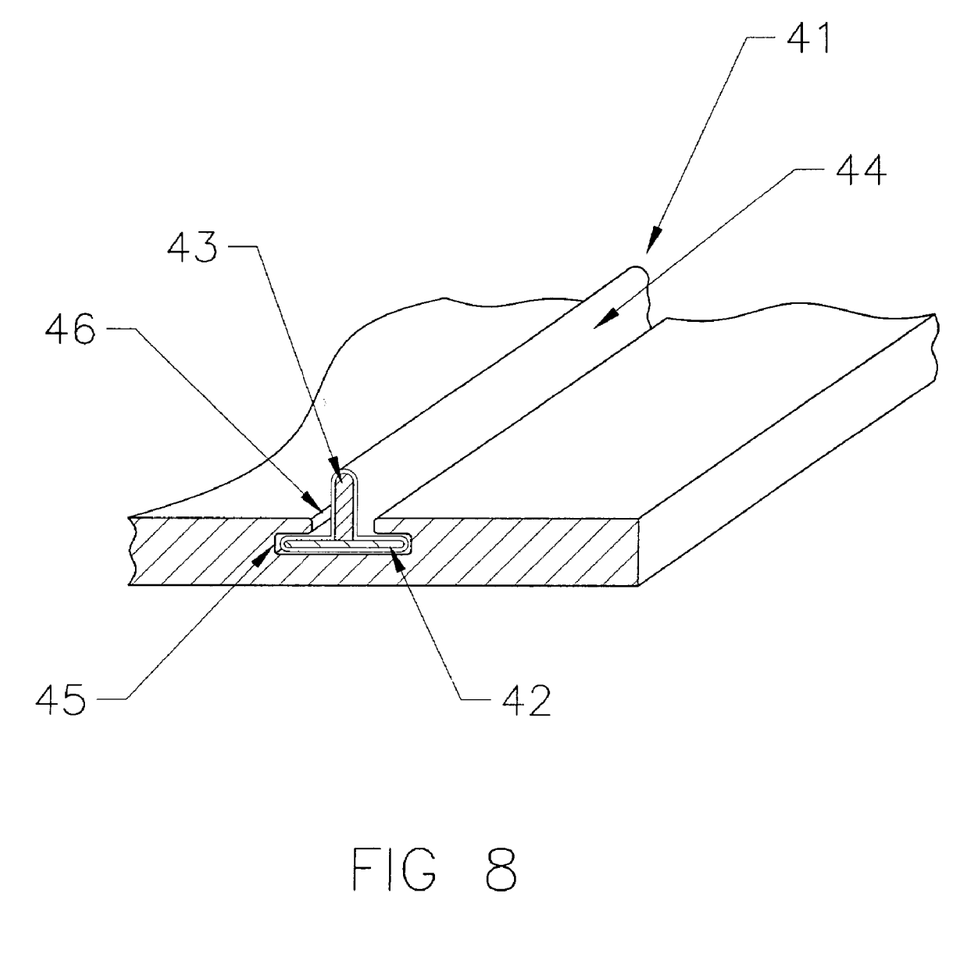

Referring now to FIG. 8, there is shown a portion around the periphery of apertures 40 at the rear of the chassis 10. These apertures 40 can receive a module, such as a power supply and cooling fans, etc., for data storage devices 18 located in the chassis 10.

It is desirable in practice to provide for electromagnetic shielding around the periphery of these openings, both to prevent leakage out and leakage in of electromagnetic interference. Conventionally, such shielding has been provided by strips of short metallic fingers which are glued around the periphery of the aperture 40. The gluing of such fingers increases labour costs and it is also a fact that such fingers or similar may well not be glued in the correct place in the first instance and that they can become detached during use.

Accordingly, in the preferred embodiment, a gasket 41 of generally T-shape cross section is employed. The gasket 41 has a plastics base 42 with an upstanding urethane foam portion 43, which are both entirely covered by a woven fabric covering 44 which is either made of metallic material or which is metallised. A preferred material for the metal or metallised coating is nickel or silver. A suitable gasket 41 is manufactured by Schlegel Systems Inc. The region of the chassis 10 around the periphery of the apertures 40 has a recess 45 of rectangular cross section which can receive the base portion of the gasket 41, the recess 45 having an opening 46 through the chassis wall through which the upstanding portion of the gasket 41 projects into the aperture 40 in the chassis 10. The depth of the recess 45 is selected so that the gasket 41 is compressed somewhat when a module is loaded in the aperture 40. The gasket 41 can be introduced into the recess 45 during assembly of the chassis 11 by sliding the gasket 41 in from one open end of the recess 45.

Not only does the preferred gasket 41 provide for good electromagnetic shielding, it also provides a good air seal around the module in the aperture 40. This is of particular advantage in a data storage device chassis 10 given that temperature control of the data storage devices 18 is provided by special cooling fans under specific software control and it is therefore desirable to prevent air leaking into or out of the chassis 10 other than through the air flow paths occupied by the cooling fans.

Embodiments of the present invention have been described with particular reference to the examples illustrated. However, it will be appreciated that variations and modifications may be made to the examples described within the scope of the present invention.

The invention claimed is:

1. A data storage device chassis for housing a plurality of data storage devices each containing a disk drive, the chassis having a plurality of walls, at least some of the walls having at least one guide strip along at least part of the length of the wall to define a plurality of bays in which data storage devices can be housed, said guide strips supporting respective data storage devices in the bays such that said data storage devices can be slid into and out of the bays by sliding along the guide strips, said at least some of the walls being composite walls that are composed of a non-metallic material such that the surface of said guide strips along which a data storage device slides is non-metallic and such that the parts of the walls that are in sliding contact with a data storage device are non-metallic, and a metal electrically conductive portion passing through the wall to provide for electrical conduction between the bays thereby providing electrical shielding for data storage devices housed in the bays and to provide for additional stiffness to the walls to damp rotary vibrations arising during operation of said disk drives when said data storage devices are housed in the bays, the metal electrically conductive portion being held captive in the wall.

2. A data storage device chassis according to claim 1, wherein the non-metallic material of said at least some of the walls is plastics.

3. A data storage device chassis according to claim 1, wherein the non-metallic material of said at least some of the walls is polycarbonate.

4. A data storage device chassis according to claim 1, wherein the non-metallic material of said at least some of the walls is plastics, each of said walls being formed by over-moulding the metal electrically conductive portion with plastics such that the metal electrically conductive portion is held captive in the plastics part of the wall.

5. A data storage device chassis according to claim 4, wherein the metal electrically conductive portion has projecting ears that are engaged by the plastics part of the wall to hold the metal electrically conductive portion captive in the plastics part of the wall.

6. A composite wall for a data storage device chassis that houses a plurality of data storage devices each containing a disk drive, the wall having at least one guide strip along at least part of the length of the wall, the guide strip being constructed and arranged to at least partially support a respective data storage device in the data storage device chassis such that said data storage device can be slid into and out of the chassis by sliding along the guide strip, the wall composite being composed of a non-metallic material such that the surface of said guide strip along which a data storage device slides is non-metallic and such that the parts of the wall that are in sliding contact with a data storage device are non-metallic, and having a metal electrically conductive portion passing through the wall to provide for electrical conduction across the wall to enable electrical shielding for data storage devices housed in the chassis and to provide for additional stiffness to the wall to damp rotary vibrations arising during operation of said disk drives when said data storage devices are housed in the bays, the metal electrically conductive portion being held captive in the wall.

7. A wall according to claim 6, wherein the non-metallic material of said wall is plastics.

8. A wall according to claim 6, wherein the non-metallic material of said wall is polycarbonate.

9. A wall according to claim 6, wherein the non-metallic material of said wall is plastics, said wall being formed by over-moulding the metal electrically conductive portion with plastics such that the metal electrically conductive portion is held captive in the plastics part of the wall.

10. A wall according to claim 9, wherein the metal electrically conductive portion has projecting ears that are engaged by the plastics part of the wall to hold the metal electrically conductive portion captive in the plastics part of the wall.

11. A method of manufacturing a composite wall for a data storage device chassis that houses a plurality of data storage devices each containing a disk drive which can be slid into and out of said data storage device chassis, the method comprising:

placing a metal conductive strip in a mould;

introducing molten non-metallic material into the mould; and, allowing the molten non-metallic material to solidify to form a non-metallic wall having at least one non-metallic guide strip along at least part of its length for slidably supporting thereon in use a data storage device and such that the parts of the wall that are in sliding contact with a data storage device are non-metallic;

the metal conductive strip being supported in the mould such that the metal conductive strip is held captive by the solidified non-metallic material and passes through the non-metallic portion of the wall to provide for electrical conduction across the wall and to provide for additional stiffness to the wall to damp rotary vibrations arising during operation of said disk drives when said data storage devices are housed in the bays.

12. A method according to claim 11, wherein the conductive strip has projecting ears that are engaged by the non-metallic portion of the wall to hold the conductive strip captive in the non-metallic portion of the wall.

13. A method according to claim 11, wherein the non-metallic material of the wall is plastics.

14. A method according to claim 11, wherein the non-metallic material of the wall is polycarbonate.

* * * * *